United States Patent
Kim

(10) Patent No.: US 10,798,825 B2
(45) Date of Patent: Oct. 6, 2020

(54) PRINTED CIRCUIT BOARD

(71) Applicant: Samsung Electro-Mechanics Co., Ltd., Suwon-si (KR)

(72) Inventor: Hye-Jin Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/562,480

(22) Filed: Sep. 6, 2019

(65) Prior Publication Data
US 2020/0154574 A1 May 14, 2020

(30) Foreign Application Priority Data
Nov. 13, 2018 (KR) .......................... 10-2018-0139058

(51) Int. Cl.
*H05K 1/02* (2006.01)
*H05K 3/00* (2006.01)
*H05K 3/42* (2006.01)

(52) U.S. Cl.
CPC .......... *H05K 3/0023* (2013.01); *H05K 3/0029* (2013.01); *H05K 3/423* (2013.01)

(58) Field of Classification Search
CPC .. H05K 1/0263; H05K 1/0296; H05K 3/0023; H05K 3/423; H05K 3/181; H05K 3/188; H05K 3/244
See application file for complete search history.

(56) References Cited

U.S. PATENT DOCUMENTS

| | | | | |
|---|---|---|---|---|
| 7,379,269 | B1 * | 5/2008 | Krounbi | G11B 5/3133 360/125.01 |
| 2005/0062130 | A1 * | 3/2005 | Ciancio | H01L 23/5223 257/532 |
| 2011/0240358 | A1 * | 10/2011 | Nakai | H05K 3/108 174/268 |
| 2012/0152599 | A1 * | 6/2012 | Kitagawa | H05K 3/381 174/257 |
| 2019/0252450 | A1 * | 8/2019 | Noudo | H01L 27/146 |

FOREIGN PATENT DOCUMENTS

| | | |
|---|---|---|
| JP | 2938738 B2 | 8/1999 |
| JP | 2938739 B2 | 8/1999 |
| JP | 2009-267173 A | 11/2009 |
| JP | 6111672 B2 | 4/2017 |
| KR | 10-2010-0065474 A | 6/2010 |

\* cited by examiner

*Primary Examiner* — Hoa C Nguyen
(74) *Attorney, Agent, or Firm* — NSIP Law

(57) ABSTRACT

A printed circuit board includes an insulating material and a circuit, formed on a surface of the insulating material. The circuit comprises a seed layer formed on the surface of the insulating material, an anti-reflection layer formed on the seed layer, and an electroplating layer formed on the anti-reflection layer.

20 Claims, 4 Drawing Sheets

FIG. 1
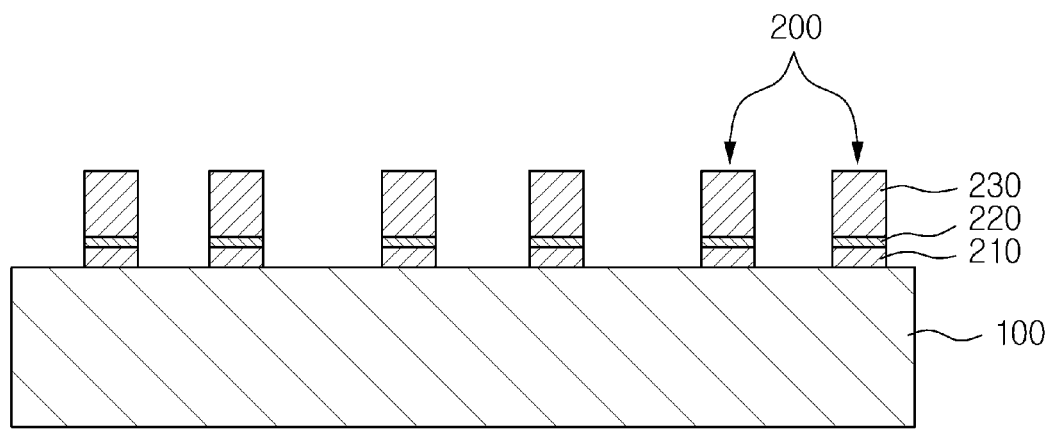
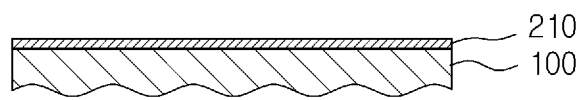
FIG. 2A
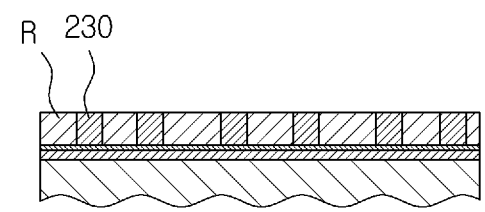
FIG. 2E
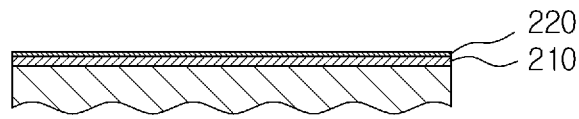
FIG. 2B
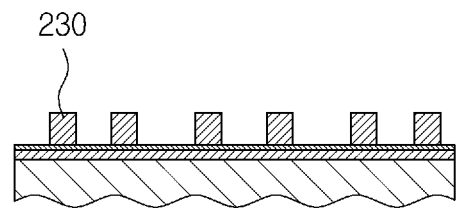
FIG. 2F
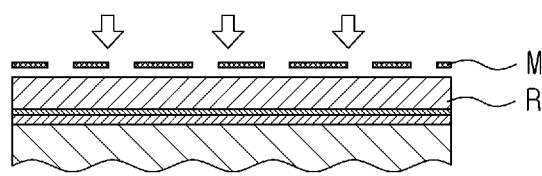
FIG. 2C
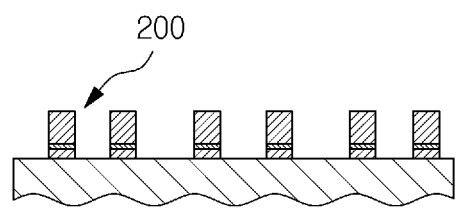
FIG. 2G
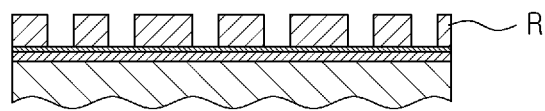
FIG. 2D

PRINTED CIRCUIT BOARD

CROSS REFERENCE TO RELATED APPLICATION

This application claims the benefit under 35 USC 119(a) of Korean Patent Application No. 10-2018-0139058, filed on Nov. 13, 2018 in the Korean Intellectual Property Office, the entire disclosure of which is incorporated herein by reference for all purposes.

BACKGROUND

1. Field

The following description relates to a printed circuit board.

2. Description of Related Art

A photolithography process is used at the time of forming a circuit of a printed circuit board. In the photolithography process, a photosensitive resist is selectively exposed and then developed, and the photosensitive resist is patterned through the photolithography process. In an example, a photosensitive resist with high light sensitivity may be used in order to form a microcircuit.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes an insulating material and a circuit, formed on a surface of the insulating material. The circuit comprises a seed layer formed on the surface of the insulating material, an anti-reflection layer formed on the seed layer, and an electroplating layer formed on the anti-reflection layer.

A thickness of the anti-reflection layer may be smaller than a thickness of the seed layer.

The anti-reflection layer may include films, and each of the films may include either one or both materials selected from $HfO_2$ and $SiO_2$.

The anti-reflection layer may be formed by alternately stacking of the films comprising $HfO_2$ and the films comprising $SiO_2$.

The surface of the insulating material may be roughened.

The seed layer and the anti-reflection layer may be formed along an undulating surface of the roughened surface.

The insulating material may include a filler material.

The roughened surface of the insulating material may undulate based on a shape of the filler material.

The printed circuit board may further include a via penetrating through the insulating material. The seed layer and the anti-reflection layer may extend along a side surface and a lower surface of the via.

The printed circuit board may further include a pad formed in a lower portion of the via. The seed layer and the anti-reflection layer along the lower surface of the via may be disposed between the via and the pad.

In another general aspect, a method of forming a circuit on a printed circuit board, includes forming a seed layer on a surface of an insulating material, forming an anti-reflection layer on the seed layer, and forming an electroplating layer on the anti-reflection layer.

The forming the electroplating layer may include forming a photosensitive resist layer on the anti-reflection layer and selectively exposing the photosensitive resist layer.

The selective exposing of the photosensitive resist layer may include forming a patterned mask on the photosensitive resist layer and selectively exposing the patterned mask to light.

A thickness of the anti-reflection layer may be formed to be smaller than a thickness of the seed layer.

The anti-reflection layer may include films, and each of the films may include either one or both materials selected from $HfO_2$ and $SiO_2$.

The anti-reflection layer may be formed by alternately stacking of the films comprising $HfO_2$ and the films comprising $SiO_2$.

The insulating material may include a filler material.

The method may include forming a via penetrating through the insulating material. The seed layer and the anti-reflection layer may be formed to extend along a side surface and a lower surface of the via.

The method may further include forming a pad formed in a lower portion of the via. The seed layer and the anti-reflection layer may be formed along the lower surface of the via are disposed between the via and the pad.

Other features and aspects will be apparent from the following detailed description, the drawings, and the claims.

BRIEF DESCRIPTION OF THE DRAWINGS

FIG. 1 is a view illustrating an example of printed circuit board.

FIGS. 2A to 2G are views illustrating examples of a manufacturing process of a printed circuit board.

Throughout the drawings and the detailed description, the same reference numerals refer to the same elements. The drawings may not be to scale, and the relative size, proportions, and depiction of elements in the drawings may be exaggerated for clarity, illustration, and convenience.

DESCRIPTION OF EXEMPLARY EMBODIMENTS

Figure 3A:
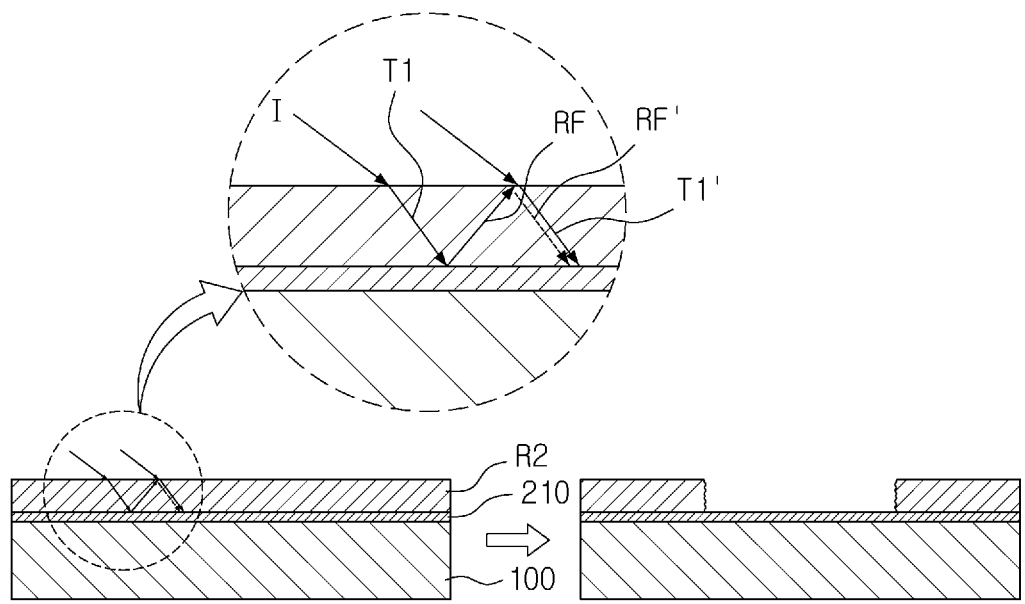
FIGS. 3A and 3B are views schematically illustrating examples of a light path depending on the presence of an anti-reflection layer.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a view illustrating an example of a printed circuit board, and FIGS. 2A to 2G are views illustrating examples of a manufacturing process of a printed circuit board.

Referring to FIG. 1, a printed circuit board includes an insulating material 100 and circuits 200. Each of the circuits 200 may include a seed layer 210, an anti-reflection layer 220, and an electroplating layer 230.

The insulating material 100 may be a plate-shaped structure formed of non-conductive material in order to insulate the circuits 200 from each other. The insulating material 100 may be formed of a material including resin. The resin of the insulating material 100 may be selected from a thermosetting resin, a thermoplastic resin, or the like. For example, the resin of the insulating material 100 may be selected from any one or any combination of any two or more of an epoxy resin, a polyimide (PI) resin, a bismaleimide-triazine (BT) resin, a liquid crystal polymer (LCP) resin, and the like may be selected, but is not limited thereto. In one example of the insulating material 100 using an epoxy resin, a prepreg (PPG) may be used.

The circuit 200 is configured to transmit electrical signals and includes conductive patterns through which the electrical signals are transmitted. The circuit 200 may include a plurality of circuit lines, and each of the circuit lines has a predetermined width and a predetermined thickness. In one example, the distance between inner sides of the adjacent circuit lines may be referred to as a space and the distance between center lines of the adjacent circuit lines may be referred to as a pitch.

The circuits 200 may be formed on a surface, for example an upper surface, of the insulating material 100 and may protrude from the surface. The circuits 200 may be further formed on the other surface, for example a lower surface, of the insulating material 100. However, only the circuits 200 formed on one surface of the insulating material 100 are illustrated in FIG. 1.

The seed layer 210 may be formed on a surface of the insulating material 100 and be formed of a metal. The seed layer 210 may be formed of copper (Cu), silver (Ag), palladium (Pd), aluminum (Al), nickel (Ni), titanium (Ti), gold (Au), platinum (Pt), and the like which have excellent electrical characteristics.

The seed layer 210 may include an electroless plating layer. The electroless plating layer may be a layer formed by an electroless plating method by precipitating a plating material on a surface of the insulating material 100 that is subjected to catalyst treatment. FIG. 2A illustrates a state in which the seed layer 210 is formed on the surface of the insulating material 100. In FIG. 2A, the seed layer 210 is formed entirely on a surface of the insulating material 100.

In an example, the seed layer 210 may further include a metal foil (not illustrated) such as a copper foil, and in this example, the electroless plating layer may be formed on the metal foil.

The anti-reflection layer 220 may be a layer that reduces the intensity of reflected light and may be formed on the seed layer 210. In FIG. 2B, the anti-reflection layer 220 is formed entirely on an upper surface of the seed layer 210.

The anti-reflection layer 220 may be formed by coating the upper surface of the seed layer 210. Examples of a coating method include a chemical vapor deposition (CVD) method and a physical vapor deposition (PVD) method, and specifically, an atmospheric plasma coating method, a sputtering method, and the like may be used.

Referring to FIG. 2C, a photosensitive resist R is formed on the anti-reflection layer 220 and selectively exposed. In addition, referring to FIG. 2D, the photosensitive resist R is developed, after the exposure, to be patterned.

The photosensitive resist R may be a positive type photosensitive resist or a negative type photosensitive resist. In a case of the positive type photosensitive resist, bonding of photopolymer of light receiving portions is cleaved in the exposure process. After that, when performing the development process, the light receiving portions where the bonding of photopolymer is cleaved are removed. In a case of the negative type photosensitive resist, in the exposure process, a photopolymerization reaction occurs in the light receiving portions of the photosensitive resist to change the light receiving portions from a single structure to a three-dimensional network structure of a chain structure, and when performing the development process, non-light receiving portions are removed. The positive type photosensitive resist R is illustrated in FIG. 2C. Therefore, referring to FIG. 2D, the light receiving portions in the photosensitive resist R are removed.

A patterned mask M is disposed on the photosensitive resist R, and the photosensitive resist R may be selectively exposed by the patterned mask M. Light used for the exposure has a wavelength range of 280 nm to 750 nm, for example, may be ultraviolet (UV) light having a wavelength of 365 nm.

When the light is incident on the photosensitive resist R in the exposure process, the anti-reflection layer 220 serves to reduce the intensity of reflected light back into the photosensitive resist R.

Figure 3B:
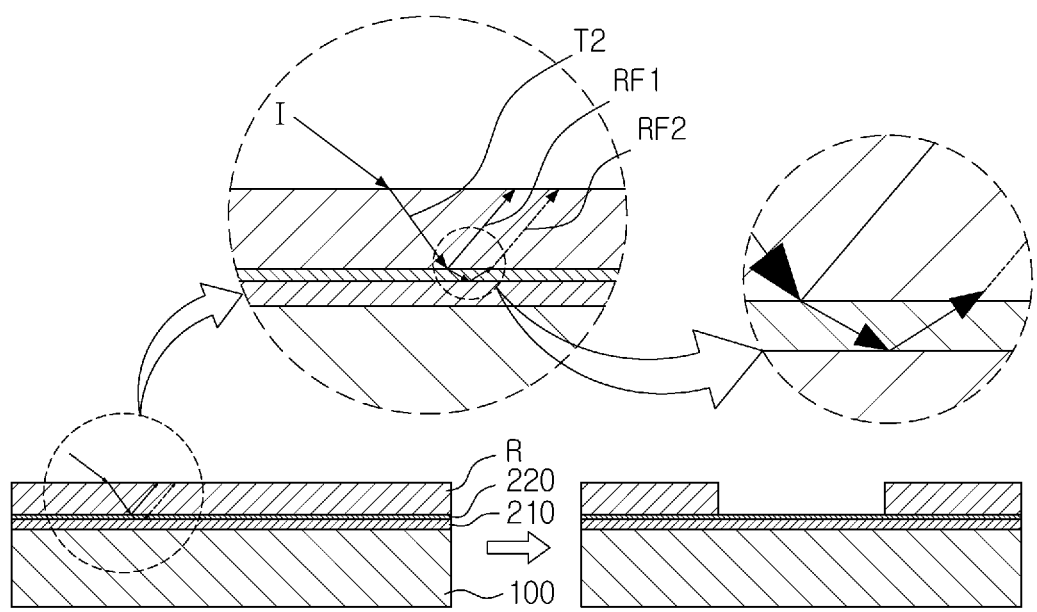

FIGS. 3A and 3B schematically illustrate examples of a light path depending the presence of the anti-reflection layer 220.

Referring to FIG. 3A, a portion of incident light I incident on the photosensitive resist R is transmitted to the inside of the photosensitive resist R (hereinafter, light transmitted to the photosensitive resist R is referred to as "transmitted light"). A portion of transmitted light T1 is reflected by a surface of the seed layer 210 and reflects back into the photosensitive resist R, and the reflected light RF reflected by the surface of the seed layer 210 is re-reflected or bounces back to an upper surface of the photosensitive resist R. A re-reflected light RF' re-reflected in the photosensitive resist R causes reinforcement and offset interference with the other transmitted light T1' incident on the photosensitive resist R; thus, light energy transferred to the photosensitive resist R may be non-uniform. As a result, irregularities and wrinkles may be formed on an inner surface of a removed area RA (an area where the light-receiving portion in the photosensitive resist R is removed through the exposure process and the development process) of the photosensitive resist R, which may cause resist flow or standing wave.

Referring to FIG. 3B, a portion of transmitted light T2 transmitted to the photosensitive resist R reflects back into the photosensitive resist R through a surface of the anti-reflection layer 220 as the first reflected light RF1. The portion of the light transmitted through the anti-reflection layer 220 reflects back into the photosensitive resist R through the surface of the seed layer 210 as second reflected light RF2. Here, since there may be a phase difference between the first reflected light RF1 and the second reflected light RF2 occurs, the first reflected light RF1 and the second reflected light RF2 might be offset from each other. Particularly, when the thickness of the anti-reflection layer 220 is ¼n (n is a natural number) of the wavelength of incident light 12, the phase difference between the first reflected light RF1 and the second reflected light RF2 becomes 180 degrees, thus, the first reflected light RF1 and the second reflected light RF2 might be completely offset from each other. In brief, light transmitted and then reflected to the photosensitive resist R may be reduced or removed by the anti-reflection layer 220. The light transmittance of the anti-reflection layer 220 may be 99% or more with respect to the light having a wavelength range of 280 nm to 750 nm. When the intensity of the reflected light returning into the photosensitive resist R is reduced by the anti-reflection layer 220, non-uniformity of the light energy due to an interference phenomenon of the reflected light and the incident light may also be reduced. As a result, the inner surface of the removed area RA of the photosensitive resist R may be relatively flattened, and the surface (side surface) of a circuit (electroplating layer 230) which is formed by the photosensitive resist R may also be flattened.

The anti-reflection layer 220 may be formed of a single film or a plurality of films.

When the anti-reflection layer 220 is formed of a single film, the anti-reflection layer 220 may include at least one material selected from $HfO_2$ and $SiO_2$. For example, the anti-reflection layer 220 may use $HfO_2$ as the main component.

In a case where the anti-reflection layer 220 is formed of a plurality of films, the anti-reflection layer 220 may be formed by repeatedly stacking materials having different refractive indices. The anti-reflection layer 220 may be formed by repeatedly stacking a film formed of a first material and a film formed of a second material. Each of the films forming the anti-reflection layer 220 may include at least one material selected from $HfO_2$ and $SiO_2$. That is, the film formed of the first material may be an $HfO_2$ film and the film formed of the second material may be a $SiO_2$ film. The final refractive index of the anti-reflection layer 220 may be adjusted by stacking materials having different refractive indices, and the refractive index of the anti-reflection layer 220 may be 1.7 to 2.42.

Figure 4:
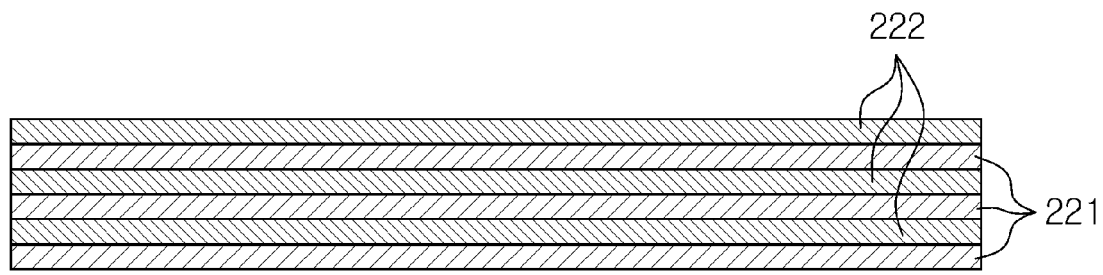
FIG. 4 is a view illustrating an example of the anti-reflection layer.

FIG. 4 illustrates an example of the anti-reflection layer 200 formed of a plurality of films. As illustrated in FIG. 4, the anti-reflection layer 220 may be formed by alternately stacking a plurality of films 221 including $HfO_2$ and a plurality of films 222 including $SiO_2$, for example. The alternately and repeatedly stacked films may alternate the use $HfO_2$ and $SiO_2$ as main components.

The anti-reflection layer 220 may have a thickness smaller than that of the seed layer 210. In a non-limiting example, the thickness of the seed layer 210 may be 1 μm to 3 μm, the thickness of the anti-reflection layer 220 may be 70 nm to 300 nm, and the thickness of the anti-reflection layer 220 may be adjusted depending on the wavelength of light. For example, the thickness of each of the films is 15 nm in FIG. 4, and the total thickness of the anti-reflection layer 220 may be 90 nm.

In an example, the total thickness of the anti-reflection layer 220 may be a value obtained by dividing the wavelength of light by a multiple of 4. For example, when using UV light having a wavelength of 360 nm, the total thickness of the anti-reflection layer 220 may be 90 nm obtained by dividing 360 by 4. When the total thickness of the anti-reflection layer 220 is adjusted by a value obtained by dividing the wavelength of light by a multiple of 4, the offset between the first reflected light and the second reflected light is completely performed, resulting in maximizing the anti-reflection effect.

Referring to FIGS. 1 and 2 again, the electroplating layer 230 occupies the majority of the circuit 200 and mainly serves as a signal transfer function. Since the electroplating layer 230 occupies the majority of the circuit 200, the thickness of the electroplating layer 230 is larger than that of the seed layer 210 or the anti-reflection layer 220.

The electroplating layer 230 is formed on the anti-reflection layer 220 and may be formed of a metal. The electroplating layer 230 may be formed of copper (Cu), silver (Ag), palladium (Pd), aluminum (Al), nickel (Ni), titanium (Ti), gold (Au), platinum (Pt), and the like which have excellent electrical characteristics, and may be formed of the same material as that of the seed layer 210.

Referring to FIG. 2E, the electroplating layer 230 is formed in a removed area RA of the photosensitive resist R. The electroplating layer 230 is formed by an electroplating method, a current is supplied from an electrolyte through the seed layer 210, and the plating material is precipitated on the seed layer 210.

When the thickness of the anti-reflection layer 220 is small, the current may be supplied through the seed layer 210 to form the electroplating layer 230 regardless of whether or not the material forming the anti-reflection layer 220 is conductive, that is, even though the material forming the anti-reflection layer 220 is non-conductive.

The electroplating layer 230 is formed in the removed area RA of the photosensitive resist R, such that the larger the flatness of the inner surface of the removed area RA of the photosensitive resist R, the lager the flatness of the surface (side surface) of the electroplating layer 230. In particular, in a case of a microcircuit, for example, a circuit having a narrow width and space and a small pitch, when the flatness of the surface of the electroplating layer 230 reaches a certain level or greater, stability and a close adhesion of the electroplating layer 230 may be ensured.

Referring to FIG. 2F, the photosensitive resist R is peeled of, and only the electroplating layer 230 remains on the anti-reflection layer 220.

Referring to FIG. 2G, the unnecessary portions except for the seed layer 210 and the anti-reflection layer 220 which are disposed below the electroplating layer 230 are removed. The removal of the seed layer 210 and the anti-reflection layer 220 may be performed by etching. Therefore, the circuits 200 are formed on the insulating material 100.

Figure 5:
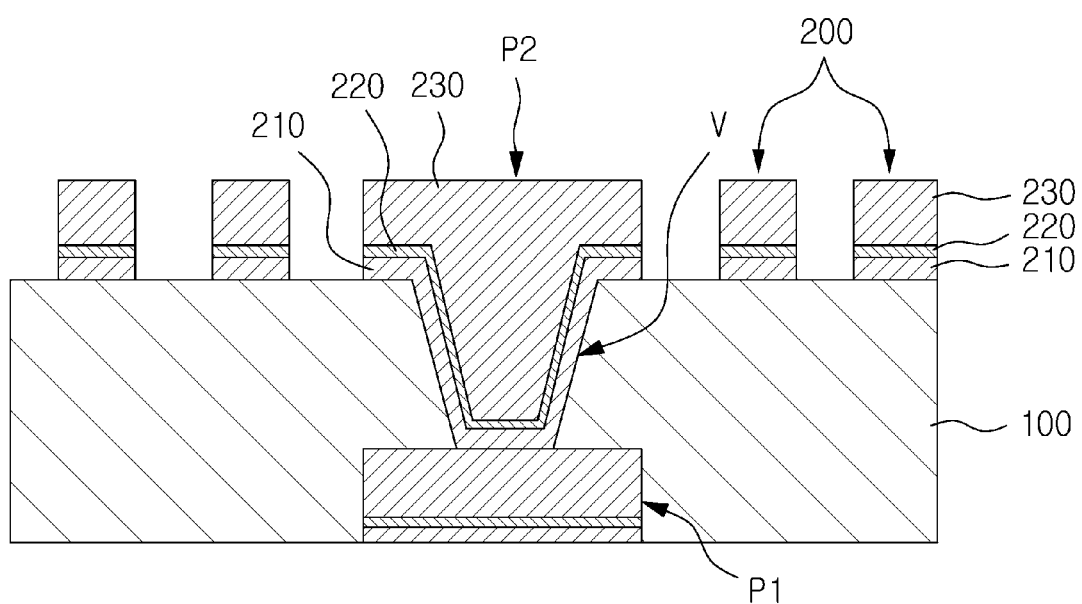
FIG. 5 is a view illustrating an example of a printed circuit board.
Figure 6:
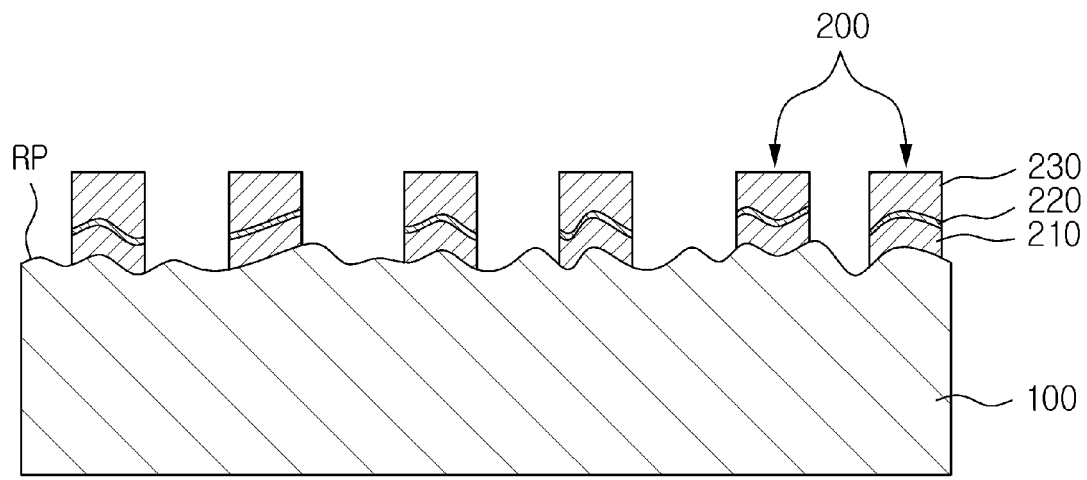
FIG. 6 is a view illustrating an example of a printed circuit board.
Figure 7:
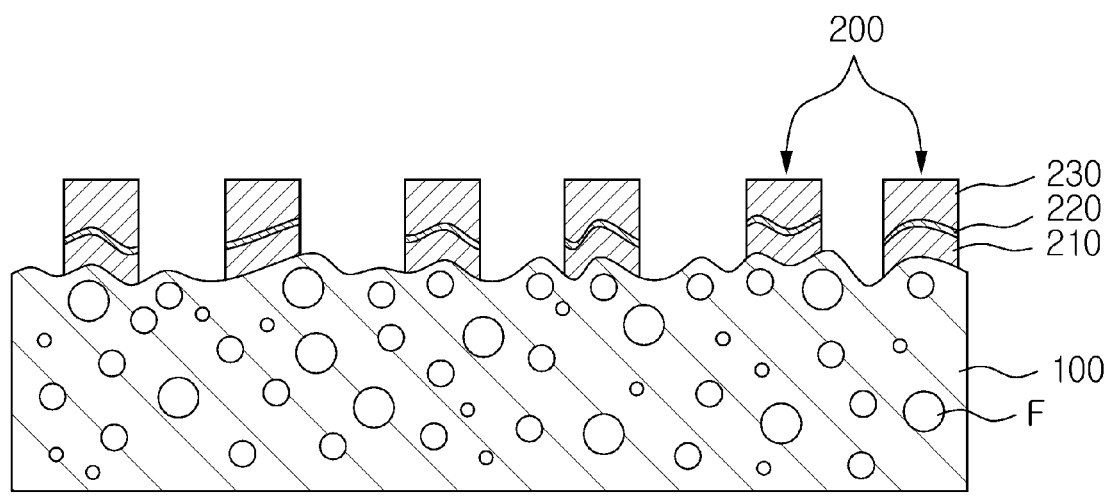
FIG. 7 is a view illustrating an example of a printed circuit board.

FIGS. 5 to 7 are views illustrating a printed circuit board according to various exemplary embodiments of the present invention.

Referring to FIG. 5, the printed circuit board, according to another exemplary embodiment of the present invention, further includes a via V in comparison with the above-described exemplary embodiment of the present invention.

The via V penetrates through the insulating material 100 and is electrically connected to the circuit 200 described above. The via V is formed of a metal and may be formed of the same material as those of the seed layer 210 and the electroplating layer 230. In addition, the via V may be formed by an electroplating method.

The seed layer 210 and the anti-reflection layer 220 may be extended from the upper surface of the insulating material 100 to a side surface and a lower surface of the via V.

In addition, a printed circuit board according to another exemplary embodiment of the present invention may further include a first pad P1 formed in a lower portion of the via V and the first pad P1 may be embedded in the insulating material 100. The seed layer 210 and the anti-reflection layer 220 may be positioned between the via V and the first pad P1. The first pad P1 may also include the seed layer 210 and the anti-reflection layer 220, similar to the circuit 200 described above.

In addition, a second pad P2 physically connected to the circuit 200 may be formed on the via V. The second pad P2 may also include the seed layer 210, the anti-reflection layer 220, and the electroplating layer 230, and the electroplating layer 230 of the second pad P2 may be integrally formed with the via V.

Referring to FIG. 6, the surface of the insulating material 100 may include a roughened surface RP. That is, irregularities may be formed on the surface of the insulating material 100. Roughness Ra of the surface of the insulating material 100 is less than 0.1 μm, and roughness Rz may be less than 1.0 μm.

The seed layer 210 and the anti-reflection layer 220 are formed on the surface of the insulating material 100 and may be formed along the undulating surface of the roughened surface RP of the insulating material 100. That is, the seed layer 210 and the anti-reflection layer 220 are formed by transferring morphology of the surface of the insulating material as it is. For this reason, the functions of the anti-reflection layer 220 may be exerted even though the surface of the insulating material 100 includes the roughened surface RP.

Referring to FIG. 7, filler material F may be contained in the insulating material 100. The filler material F may be an inorganic filler material or an organic filler material. Examples of the inorganic filler material which may be used is any one or any combination of any two or more of silica ($SiO_2$), alumina ($Al_2O_3$), silicon carbide (SiC), barium sulfate ($BaSO_4$), talc, mud, mica powders, aluminum hydroxide ($AlOH_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanate ($BaTiO_3$), and calcium zirconate ($CaZrO_3$).

When the filler material F is included in the insulating material 100, the rigidity of the insulating material 100 may be enhanced.

In an example, the roughened surface RP of the insulating material 100 may be formed or undulate based on the shape of the filler material F. In particular, when the filler material F inside the insulating material 100 is affected by the components positioned outside the fillers F, the surface of the insulating material 100 may undulate based on the shape of the fillers F.

As described above, when the anti-reflection layer is formed on the seed layer at the time of forming the circuit, the light energy is relatively evenly transferred to the photosensitive resist in the exposure process of the photosensitive resist used at the time of forming the electroplating layer, and thus the flatness of the inner surface of the removed area of the photosensitive resist is improved. As a result, the flatness of the electroplating layer formed in the removed area of the photosensitive resist is improved, and the close adhesion may be enhanced. In particular, since the photosensitive resist with high light sensitivity is used in a case of the microcircuit, an effect of the anti-reflection layer may be further required.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
an insulating material; and
a circuit, formed on a surface of the insulating material, comprising
a seed layer formed on the surface of the insulating material,
an anti-reflection layer formed on the seed layer, and
an electroplating layer formed on the anti-reflection layer.

2. The printed circuit board of claim 1, wherein a thickness of the anti-reflection layer is smaller than a thickness of the seed layer.

3. The printed circuit board of claim 1, wherein the surface of the insulating material is roughened.

4. The printed circuit board of claim 3, wherein the seed layer and the anti-reflection layer are formed along an undulating surface of the roughened surface.

5. The printed circuit board of claim 3, wherein the insulating material comprises a filler material.

6. The printed circuit board of claim 5, wherein the roughened surface of the insulating material undulates based on a shape of the filler material.

7. The printed circuit board of claim 1, further comprising:
a via penetrating through the insulating material,
wherein the seed layer and the anti-reflection layer extend along a side surface and a lower surface of the via.

8. The printed circuit board of claim 7, further comprising:
a pad formed in a lower portion of the via,
wherein the seed layer and the anti-reflection layer along the lower surface of the via are disposed between the via and the pad.

9. The printed circuit board of claim 1, wherein the anti-reflection layer comprises films, and each of the films comprises either one or both of $HfO_2$ and $SiO_2$.

10. A printed circuit board comprising:
an insulating material; and
a circuit, formed on a surface of the insulating material, comprising
a seed layer formed on the surface of the insulating material,
an anti-reflection layer formed on the seed layer, and
an electroplating layer formed on the anti-reflection layer,
wherein the anti-reflection layer comprises films, and each of the films comprises either one or both of $HfO_2$ and $SiO_2$.

11. The printed circuit board of claim 10, wherein the anti-reflection layer is formed by alternately stacking of the films comprising $HfO_2$ and the films comprising $SiO_2$.

12. A method of forming a circuit on a printed circuit board, comprising:
forming a seed layer on a surface of an insulating material;
forming an anti-reflection layer on the seed layer; and
forming an electroplating layer on the anti-reflection layer.

13. The method of claim 12, wherein the forming the electroplating layer comprises
forming a photosensitive resist layer on the anti-reflection layer and selectively exposing the photosensitive resist layer.

14. The method of claim 13, wherein the selective exposing of the photosensitive resist layer comprises forming a patterned mask on the photosensitive resist layer and selectively exposing the patterned mask to light.

15. The method of claim 12, wherein a thickness of the anti-reflection layer is formed smaller than a thickness of the seed layer.

16. The method of claim 12, wherein the anti-reflection layer comprises films, and
each of the films comprises either one or both materials selected from $HfO_2$ and $SiO_2$.

17. The method of claim 16, wherein the anti-reflection layer is formed by alternately stacking of the films comprising $HfO_2$ and the films comprising $SiO_2$.

18. The method of claim 16, wherein the insulating material comprises a filler material.

19. The method of claim 16, further comprising:
forming a via penetrating through the insulating material,
wherein the seed layer and the anti-reflection layer are formed to extend along a side surface and a lower surface of the via.

20. The method of claim 19, further comprising:
forming a pad formed in a lower portion of the via,
wherein the seed layer and the anti-reflection layer formed along the lower surface of the via are disposed between the via and the pad.

* * * * *